United States Patent
Funahashi et al.

(10) Patent No.: US 7,289,345 B2
(45) Date of Patent: Oct. 30, 2007

(54) CAM CIRCUIT AND OUTPUT METHOD THEREOF

(75) Inventors: Yorimasa Funahashi, Osaka (JP); Yasuyuki Okada, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/577,720

(22) PCT Filed: Nov. 10, 2004

(86) PCT No.: PCT/JP2004/016669
§ 371 (c)(1),
(2), (4) Date: May 2, 2006

(87) PCT Pub. No.: WO2005/048267
PCT Pub. Date: May 26, 2005

(65) Prior Publication Data
US 2007/0081373 A1    Apr. 12, 2007

(30) Foreign Application Priority Data
Nov. 12, 2003 (JP) .............................. 2003-382547
Jun. 22, 2004 (JP) .............................. 2004-183382

(51) Int. Cl.
*G11C 15/04* (2006.01)
(52) U.S. Cl. ........................ 365/49; 365/195
(58) Field of Classification Search ................. 365/195
See application file for complete search history.

(56) References Cited
U.S. PATENT DOCUMENTS
5,226,005 A * 7/1993 Lee et al. ...................... 365/49
5,828,593 A * 10/1998 Schultz et al. ................. 365/49
6,389,524 B1   5/2002 Sato
6,859,377 B2 * 2/2005 Yamagata ..................... 365/49
2003/0081442 A1   5/2003 Tsuda et al.

FOREIGN PATENT DOCUMENTS
| JP | 4-85795 A | 3/1992 |
| JP | 9-198878 A | 7/1997 |
| JP | 2000-30469 A | 1/2000 |
| JP | 2001-184870 A | 7/2001 |
| JP | 2003-141879 A | 5/2003 |

* cited by examiner

*Primary Examiner*—Tan T. Nguyen
(74) *Attorney, Agent, or Firm*—McDermott Will & Emery LLP

(57) ABSTRACT

A CAM circuit according to the present invention used for a cash memory and the like, wherein an address is obtained by designating a data, comprises a data compare unit for comparing a data stored in a memory unit to a data of a compare line in a state where a match line is activated and a consistency cancel circuit for forcibly making the match line inactive when a word line and a write instruction signal are both activated. When a write operation and a retrieve operation are simultaneously instructed, a result of the retrieval is forcibly judged to be inconsistent at a write address, thereby it is unnecessary to prohibit the simultaneous execution of the write operation and the retrieve operation.

8 Claims, 14 Drawing Sheets

CAM CIRCUIT AND OUTPUT METHOD THEREOF

RELATED APPLICATIONS

This application is the U.S. National Phase under 35 U.S.C. § 371 of International Application No. PCT/JP2004/016669, filed on Nov. 10, 2004, which in turn claims the benefit of Japanese Application No. 2003-382547, filed on Nov. 12, 2003, and Japanese Application No. 2004-183382, filed on Jun. 22, 2004, the disclosures of which Applications are incorporated by reference herein.

FIELD OF THE INVENTION

The present invention relates to a CAM (Content Addressable Memory) circuit. The CAM is a memory for obtaining an address at which a memorized data identical to a value of a designated data is retained. The CAM is used for a network switch, a cash memory and the like.

BACKGROUND TECHNOLOGY

In general, an operation of the CAM includes a write operation for writing a storage data, a read operation for retrieving the storage data and a retrieve operation for detecting a consistency between a retrieval data and the storage data. In the retrieve operation, the consistency between the retrieval data and the storage data is simultaneously detected in all bits, and a result of the retrieve operation at each address is outputted.

A conventional CAM memory cell 100 shown in FIG. 10 comprises a memory unit 101 for storing data and a data compare unit 102 for detecting the consistency between the data stored in the memory unit 101 and a retrieval data inputted from outside of the CAM. A compare line CP and an anti-compare line /CP for inputting a retrieval data are connected to the data compare unit 102.

In the write operation, a word line WL at a write address is rendered "H" so that transistors 103 and 104 are turned on. Then, a write data in a bit line BL and a reversal data in an anti-bit line /BL are stored in inverters 105 and 106.

In the retrieve operation, a transistor 110 is turned on so that a match line MT is pre-charged, and a value of the compare line CP and a value of the anti-compare line /CP as a reversal data thereof are compared to each other in the data compare unit 102. The match line MT retains the "H" level when the compared values are consistent with each other, while the "H" level turns to an "L" level when they are inconsistent.

For example, when the storage data shows "1", an output of the inverter 106 is at the "H" level and an output of the inverter 105 is at the "L" level, and transistors 107 and 108 corresponding to the respective inverters are turned on and off respectively. When "1" is supplied to the compare line CP and "0" is supplied to the anti-compare line /CP in the foregoing conditions, a transistor 109 retains the OFF state, and the pre-charged match line MT retains the "H" level. In other words, the match line MT is at the "H" level because the storage data and the retrieval data both show the value "1" and are, therefore, consistent with each other.

On the contrary to the foregoing description, when "0" is supplied to the compare line CP and "1" is supplied to the anti-compare line /CP, the transistor 109 is in the ON state, and the match line MT is at the "L" level. In other words, the match line MT turns to the "L" level because the storage data shows "1" and the retrieval data shows "0" and are, therefore, inconsistent with each other.

Further, some of the CAMs have a mask function. FIG. 11 shows a diagram of a memory cell of a conventional CAM provided with the mask function. A data compare unit 203 is interposed between a memory unit 201 and a mask memory cell 202. A transistor 204 in the data compare unit 203 corresponds to the transistor 109 shown in FIG. 10. A source of a transistor 205 connected to the mask memory cell 202 in the data compare unit 203 is connected to a drain of the transistor 204.

When "0" is stored in the mask memory cell 202 here, the transistor 205 is turned on, and the data compare unit 203 operates in the same manner as shown in FIG. 10. When "1" is stored in the mask memory cell 202, the transistor 205 is turned off, which renders the transistor 204 inactive. Accordingly, the match line MT turns to the "H" level irrespective of a state of the memory unit 201.

FIG. 12 is a timing chart of the write operation of the CAM, and FIG. 13 is a timing chart of the retrieve operation of the CAM.

Given that the write operation and the retrieve operation are both instructed based on an identical clock cycle in a conventional structure of a circuit as shown in FIG. 14, there is an inconvenience that an output of the match line becomes uncertain because an indefinite data that is currently written and not finally determined in the memory unit is compared to the retrieval data. In order to avoid the inconvenience, it is necessary to prohibit the execution of both the write and retrieve operations based on the identical clock cycle, however, it reduces an efficiency of the retrieve operation.

DISCLOSURE OF THE INVENTION

In order to solve the aforementioned problem, the present invention provides the following means.

(1-a) As a first embodiment, a CAM circuit according to the present invention comprises:

a memory unit connected to a word line and a bit line;

a data compare unit connected to a match line and a compare line, the data compare unit comparing a data stored in the memory unit to a data of the compare line in a state where the match line is activated;

a consistency cancel circuit provided in each of word line and e match line, the consistency cancel circuit enforcing to make the match line inactive when the word line and a write instruction signals are both activated.

Given that a write operation and a retrieve operation are both instructed based on an identical clock cycle in the foregoing structure, the write instruction signal to the memory unit, the word line and the match line at a write address are all activated, and the consistency cancel circuit is thereby operated so that the match line in the active state is forcibly made inactive. More specifically, a result of comparing any unstable data during the write operation to a retrieval data is forcibly judged to be inconsistent at the write address. In this manner, it becomes unnecessary to prohibit the comparison of the retrieval data to storage data. On the other hand, the consistency canceling circuit is not operated at any address other than the write address, and the operation is carried out that the retrieval data and the storage data are compared to each other. As a result, it becomes unnecessary to prohibit the execution of the write and retrieve operations based on the identical clock cycle, and the execution of the both operations is thereby simultaneously allowed.

(1-b) An output method of the CAM circuit according to the present invention relating to the first solution comprising:

a memory unit connected to a word line and a bit line; and a data compare unit connected to a match line and a compare line, the data compare unit comparing a data stored in the memory unit to a data of the compare line in a state where the match line is activated, wherein a state of the corresponding match line is forcibly judged to be inconsistent in the case of detecting that the word line and a write instruction signal are both in an enable state when a write operation and a retrieve operation are both instructed based on an identical clock cycle.

According to the foregoing constitution, the execution of both the write operation and the retrieve operation based on the identical clock cycle is thereby simultaneously allowed in the same manner as described earlier.

(2-a) As a second solution, a CAM circuit according to the present invention further in addition to the CAM circuit as the first solution comprising:

a column select circuit for selecting the bit line in accordance with a column selection signal; and a consistency cancellation control circuit for generating and outputting a consistency cancel/select signal with respect to the consistency canceling circuit in accordance with a combination of the write instruction signal and the column selection signal.

The foregoing constitution relates to a case that an access can be made at each memory cell by a column address. The consistency canceling circuit is provided in each memory cell. Given that the write operation and the retrieve operation are both instructed based on the identical clock cycle after the column address is designated, the write instruction signal to the memory unit, the word line and the match line are all activated at the write address, and the consistency cancellation control circuit supplies the consistency cancel/select signal to the consistency canceling circuit corresponding to the write address, while the consistency cancel/select signal is ineffective to the corresponding consistency canceling circuit at any address other than the write address. By the foregoing manner, only the retrieval result at the address selected based on the word line and the column selection signal is judged to be inconsistent instead of making inconsistent the retrieval results at all of the addresses where the word line is in the enable state. As a result, both of the write and the retrieve operations can be simultaneously executed in the case of providing the column address, while the inconsistency is not forcibly judged at any unselected column address. Then, the retrieve operation can be efficiency executed at each memory cell.

(2-b) An output method of the CAM circuit according to the present invention relating to the second solution is an output method of a CAM circuit further comprising a column select circuit for selecting the bit line in accordance with a column selection signal in the CAM circuit as the first solution, wherein the corresponding match line is made to be inconsistent in the case of detecting that the write instruction signal, the word line and the column selection signal are all in the enable state when the write operation to the memory and the retrieve operation are both instructed based on the identical clock cycle.

According to the foregoing constitution, the inconsistency is not forcibly made at any address unselected address in the same manner in the case of providing the column address as described above, thereby the retrieve operation can be carried out effectively.

(3-a) As a third solution, a CAM circuit according to the present invention further in addition to the CAM circuit as the first solution comprising:

a write data compare circuit for comparing a signal of a path until the write data is written in the memory unit (namely, a path from a data input unit of the CAM circuit through to the bit line) to the retrieval data outside the memory unit; and a restoration adjust circuit for denying the output of the forcible inconsistency by the consistency cancel circuit at the write address when a comparison result by the write data compare circuit shows the consistency.

According to the foregoing constitution, the retrieve operation is executed even at the write address when the write operation and the retrieve operation are both instructed based on the identical clock cycle. However, the retrieve operation is not executed after the write data is stored at the write address, but executed in the path before the write data is written in the memory based on the comparison of the write data and the retrieving data to each other by the write data compare circuit. The comparison result obtained in the data compare unit is forcibly made to be inconsistent by the consistency cancel circuit, while the retrieve operation is executed in the write data compare circuit. The restoration adjust circuit accepts the process of the forcible inconsistency in the consistency cancel circuit when the comparison result with respect to the write data and the retrieval data in the write data compare circuit shows the inconsistency, however, denies the process of the forcible inconsistency by the consistency cancel circuit when the comparison result in the write data compare circuit shows the consistency. Thereby, the result of the retrieve operation is judged to be consistent.

As a result, the simultaneous execution of the write operation and the retrieve operation is allowed, and the comparison result in the data compare unit is not forcibly made to be inconsistent but is effectively utilized when the comparison result between the write data and the retrieval data in the write data compare circuit shows the consistency. Thereby, the retrieve operation can be carried out efficiently.

(3-b) An output method of the CAM circuit according to the present invention relating to the third solution is characterized in that the signal of the path until the write data is written in the memory unit and the retrieval data are carried out outside the memory unit when the write operation to the memory and the retrieve operation are both instructed based on the identical clock cycle, and the consistency detection result at the write address is changed from the inconsistency to the consistency according to the comparison result in the output method of the CAM circuit as the first solution.

According to the foregoing constitution, the comparison result in the write data compare unit is effectively accepted when the comparison result in the write data compare circuit shows the consistency in the same manner as described earlier so that the retrieve operation can be efficiently carried out.

(4-a) As a fourth solution, a CAM circuit according to the present invention comprises:

a CAM memory cell comprising a CAM memory unit connected to a word line and a bit line;

a data compare unit connected to a match line and a compare line and to compare a data stored in the CAM memory unit to a data in the compare line in a state where the match line is activated;

a mask memory cell comprising a mask bit line, the word line shared with the CAM memory unit and a mask memory unit, which stops the operation of the data compare unit in the active state;

a consistency cancel circuit for changing a value of the match line according to a value of a write instruction signal and the word line;

a write data compare circuit for comparing a signal of a path until the write data is written in the memory unit to the retrieval data outside the memory unit; and a restoration control circuit for denying the output of the forcible inconsistency by the consistency cancel circuit at the write address when a result of the comparison by the write data compare circuit shows the consistency.

The fourth solution is the one that third solution is applied to the CAM circuit provided with the mask function. According to the foregoing constitution, the retrieve operation can be carried out efficiently by accepting the comparison result effectively when the comparison result in the write data compare circuit shows consistency in the CAM circuit provided with the mask function in the same manner as in the third solution. In addition, the mask function can be exerted at a desired level when the mask memory cell is activated.

(4-b) An output method of the CAM circuit according to the present invention relating to the fourth solution is an output method of the CAM circuit comprising:

a CAM memory cell comprising a CAM memory unit connected to a word line and a bit line;

a data compare unit connected to a match line and a compare line and to compare a data stored in the CAM memory unit to a data in the compare line in a state where the match line is activated;

a mask memory cell comprising a mask bit line, the word line shared with the CAM memory unit and a mask memory unit, which stops the operation of the data compare unit in the active state;

a consistency cancel circuit for changing a value of the match line according to a value of a write instruction signal and the word line; and a write data compare circuit for comparing a signal of a path until the write data is written in the memory unit to the retrieval data outside the memory, wherein The corresponding match line is forcibly made to be inconsistent in the case of detecting that the word line and a write instruction signal are both in an enable state when a write operation and a retrieve operation are both instructed based on an identical clock cycle, the signal of the path until the write data is written in the memory unit and the retrieval data are compared to each other outside CAM memory unit and the mask memory unit, and the consistency detection result at the write address is changed from the inconsistency to the consistency according to a result of the comparison.

According to the foregoing constitution, the retrieve operation can be carried out efficiently by accepting the comparison result effectively when the comparison result in the write data compare circuit shows consistency in the CAM circuit provided with the mask function in the same manner as in the third solution. In addition, the mask function can be exerted at a desired level when the mask memory cell is activated. As a result, the following advantages are generated.

According to the present invention, it becomes unnecessary to prohibit both of the write operation and the retrieve operation based on the identical clock cycle, and the simultaneous execution of both operations is allowed.

Hereinafter, the preferred embodiments of a CAM circuit according to the present invention are described in detail with the accompanying drawings.

DETAILED DESCRIPTION OF PREFERRED EMBODIMENTS

First Preferred Embodiment

Figure 1:
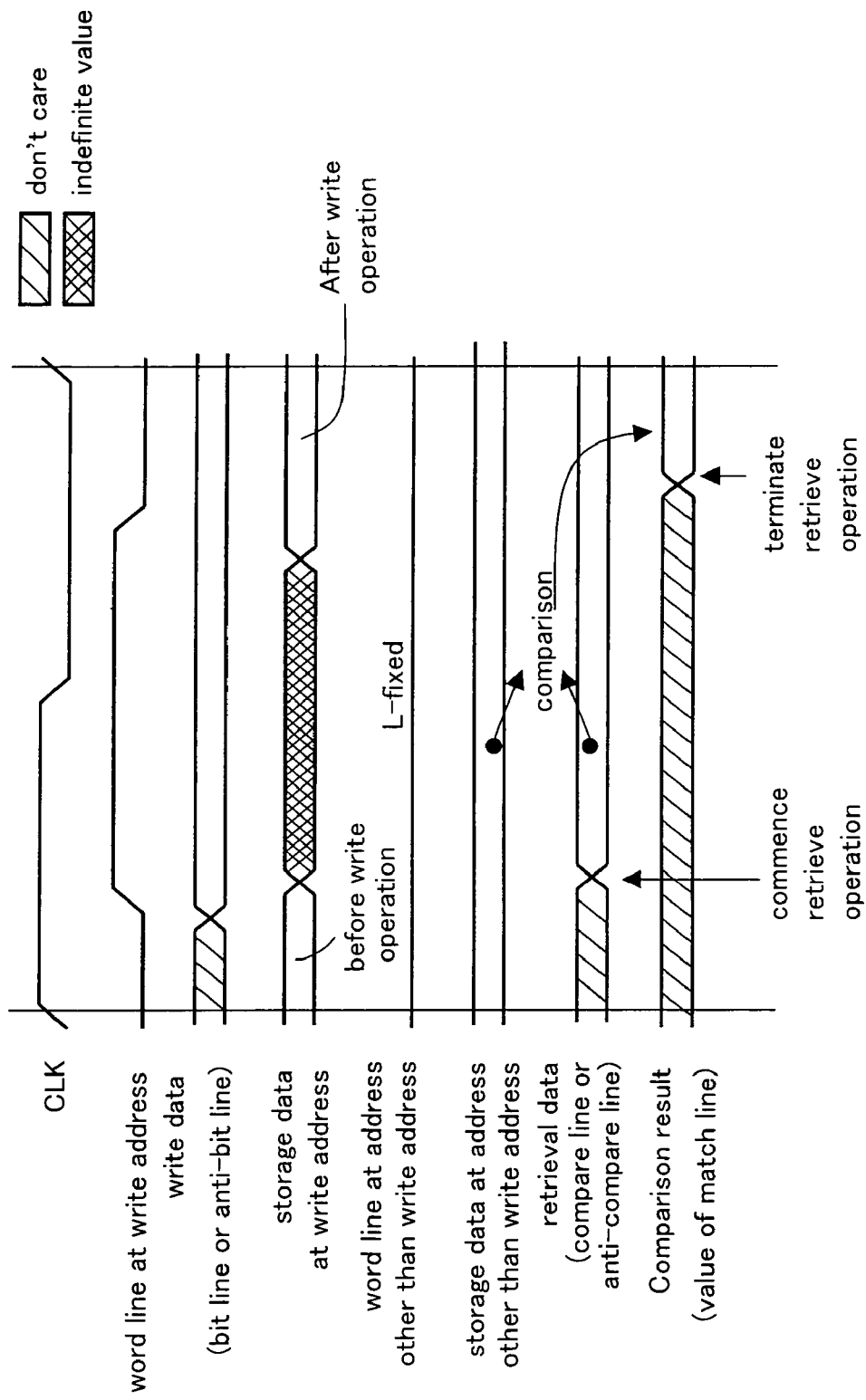
FIG. 1 is a timing chart of a CAM circuit according to a first preferred embodiment of the present invention.

FIG. 1 is a timing chart of a CAM circuit according to a first preferred embodiment of the present invention. As shown in the drawing, a storage data at a write address becomes indefinite during a write operation. Therefore, when the write operation and a retrieve operation are both instructed based on an identical clock cycle, the retrieve result with respect to a retrieval data and the storage data at the write address is judged to be inconsistent. Then, only the storage data at any address other than the write address is compared to the values of a compare line and an anti-compare line.

Accordingly, it becomes unnecessary to prohibit the write operation and the retrieve operation based on the identical clock cycle, and the simultaneous execution of both operations is allowed.

Figure 2:
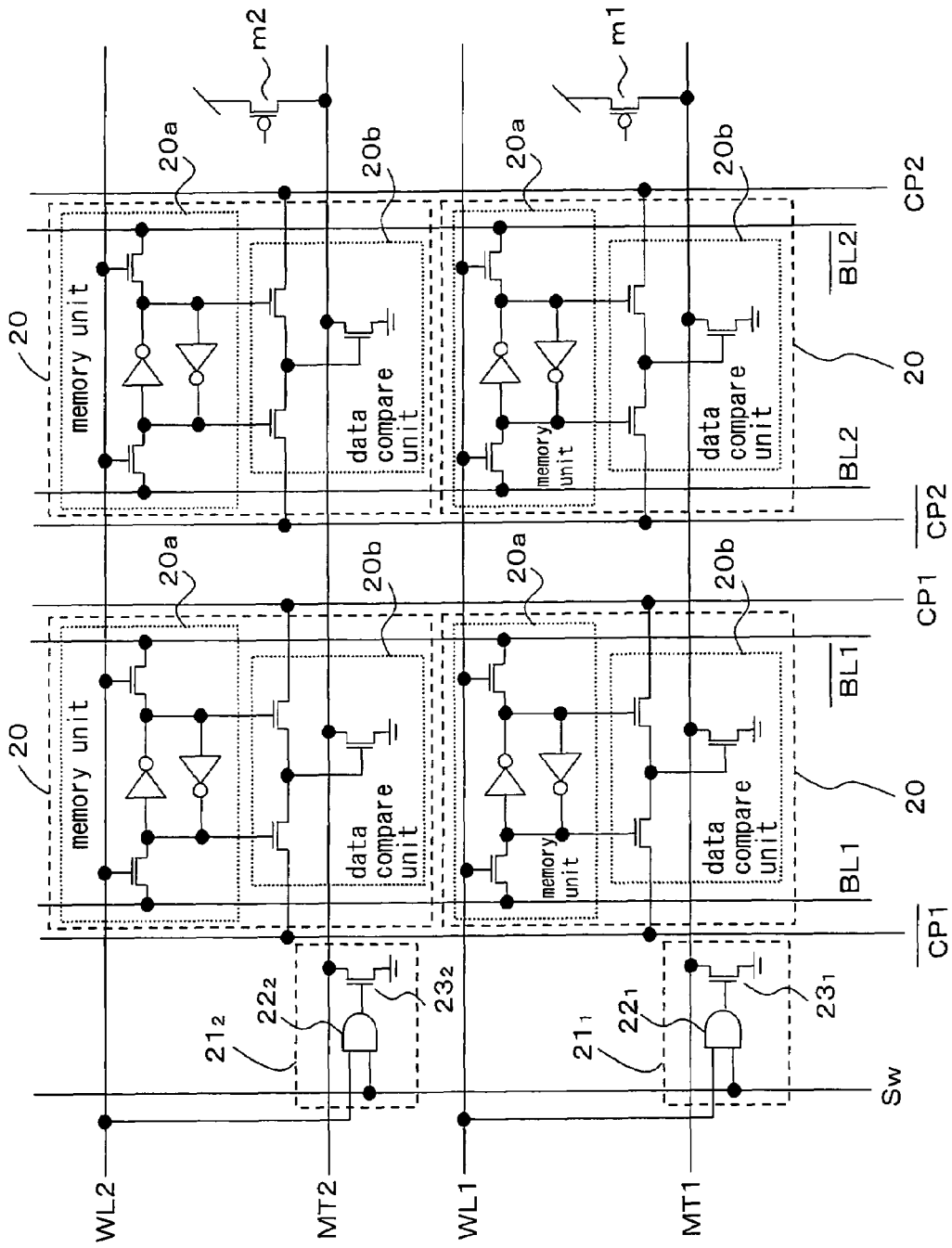
FIG. 2 shows a diagram of the CAM circuit according to the first preferred embodiment.
Figure 10:
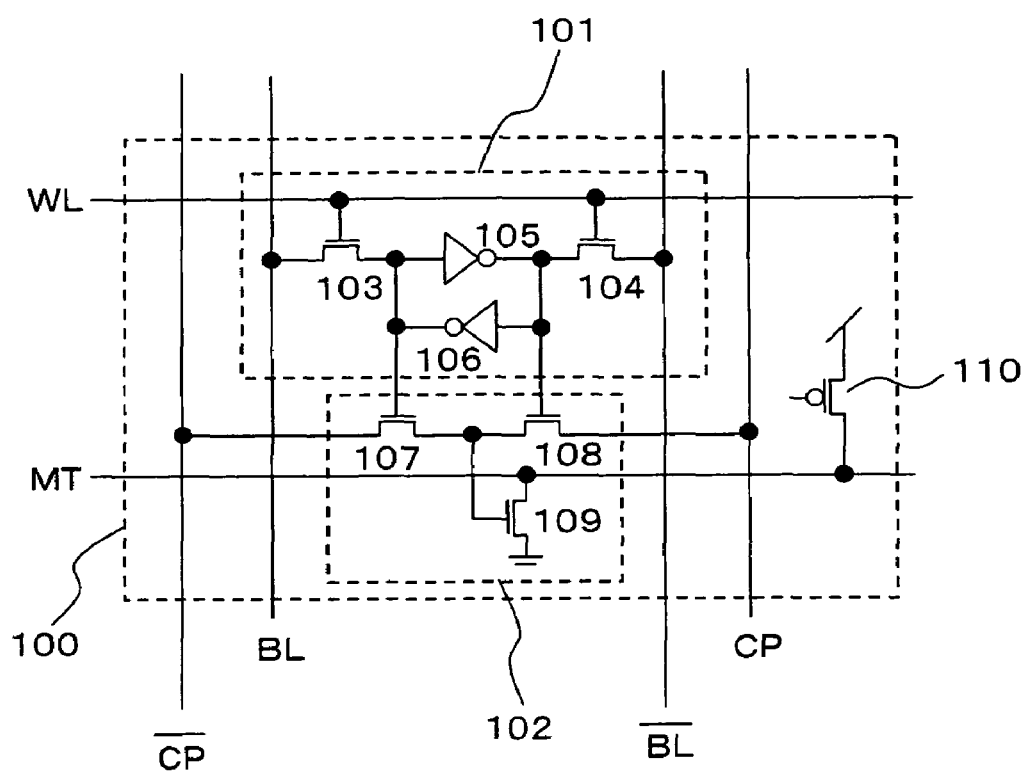
FIG. 10 shows a diagram of a memory cell of a conventional CAM.
Figure 11:
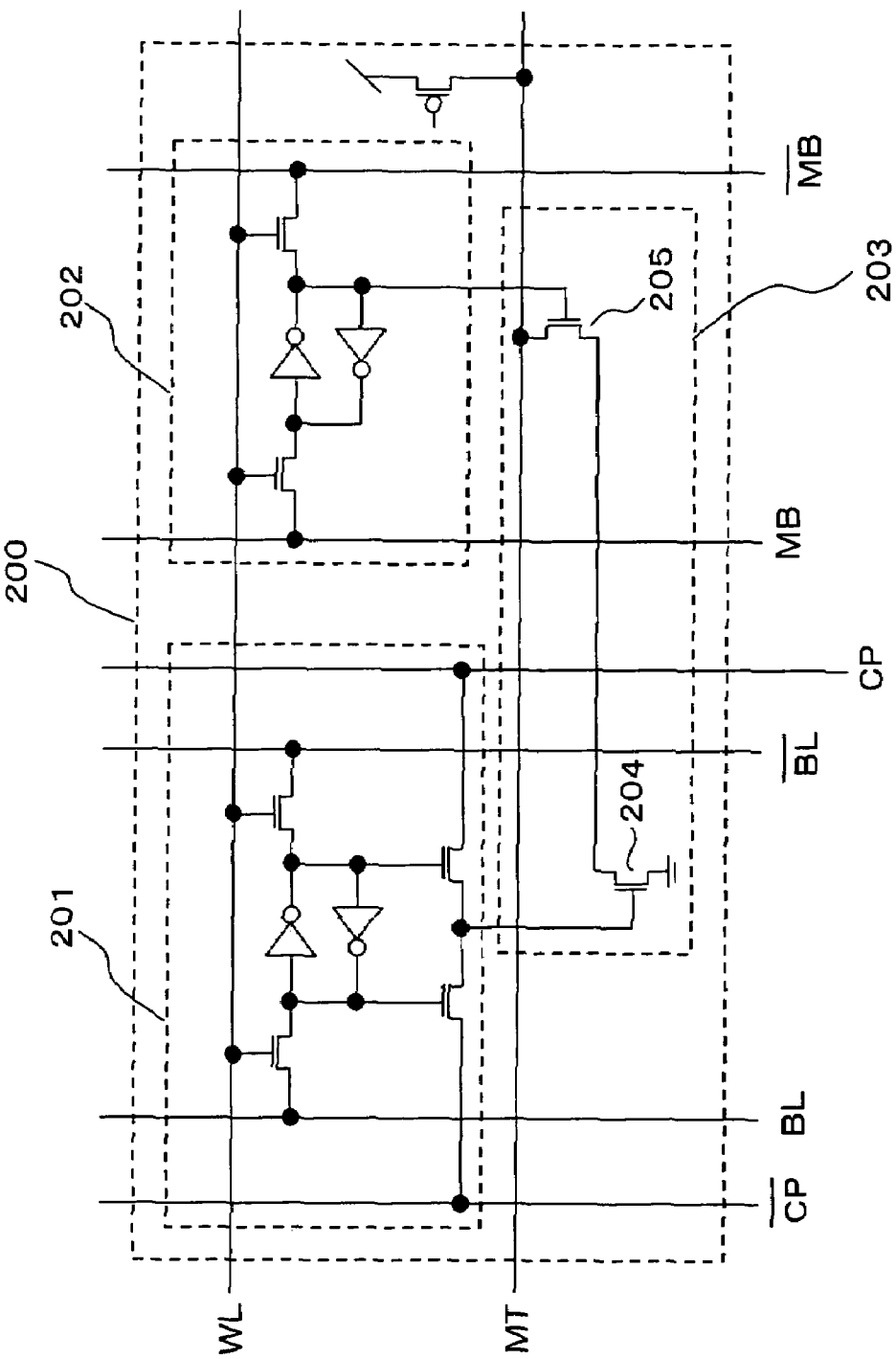
FIG. 11 shows a diagram of a memory cell of a conventional CAM provided with mask function.
Figure 12:
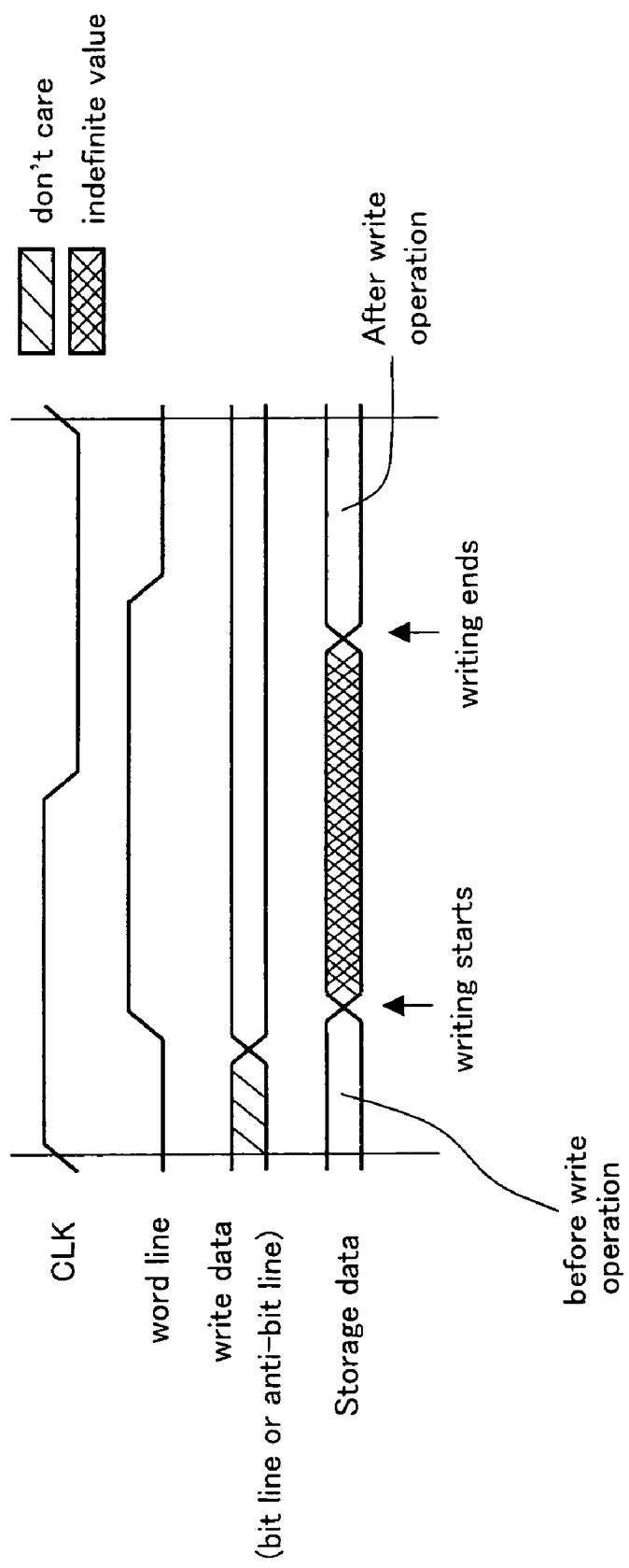
FIG. 12 is a timing chart of a write operation of the CAM.
Figure 13:
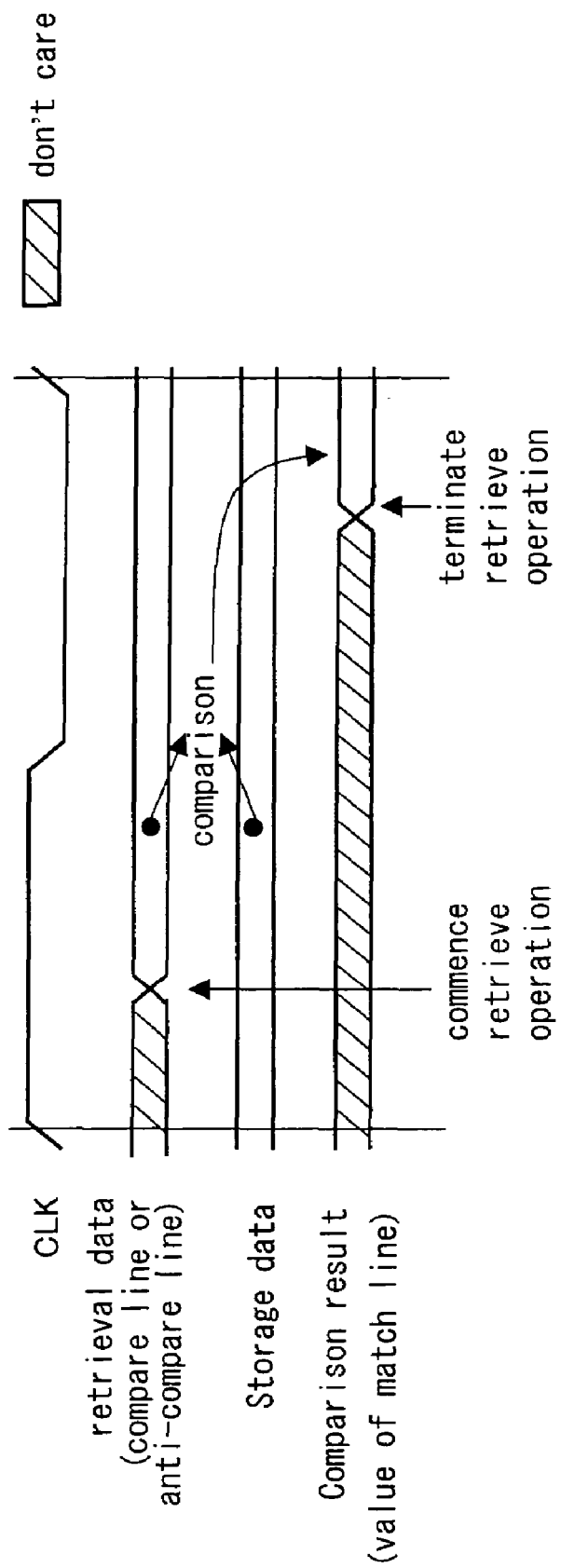
FIG. 13 is a timing chart of a retrieve operation of the CAM.
Figure 14:
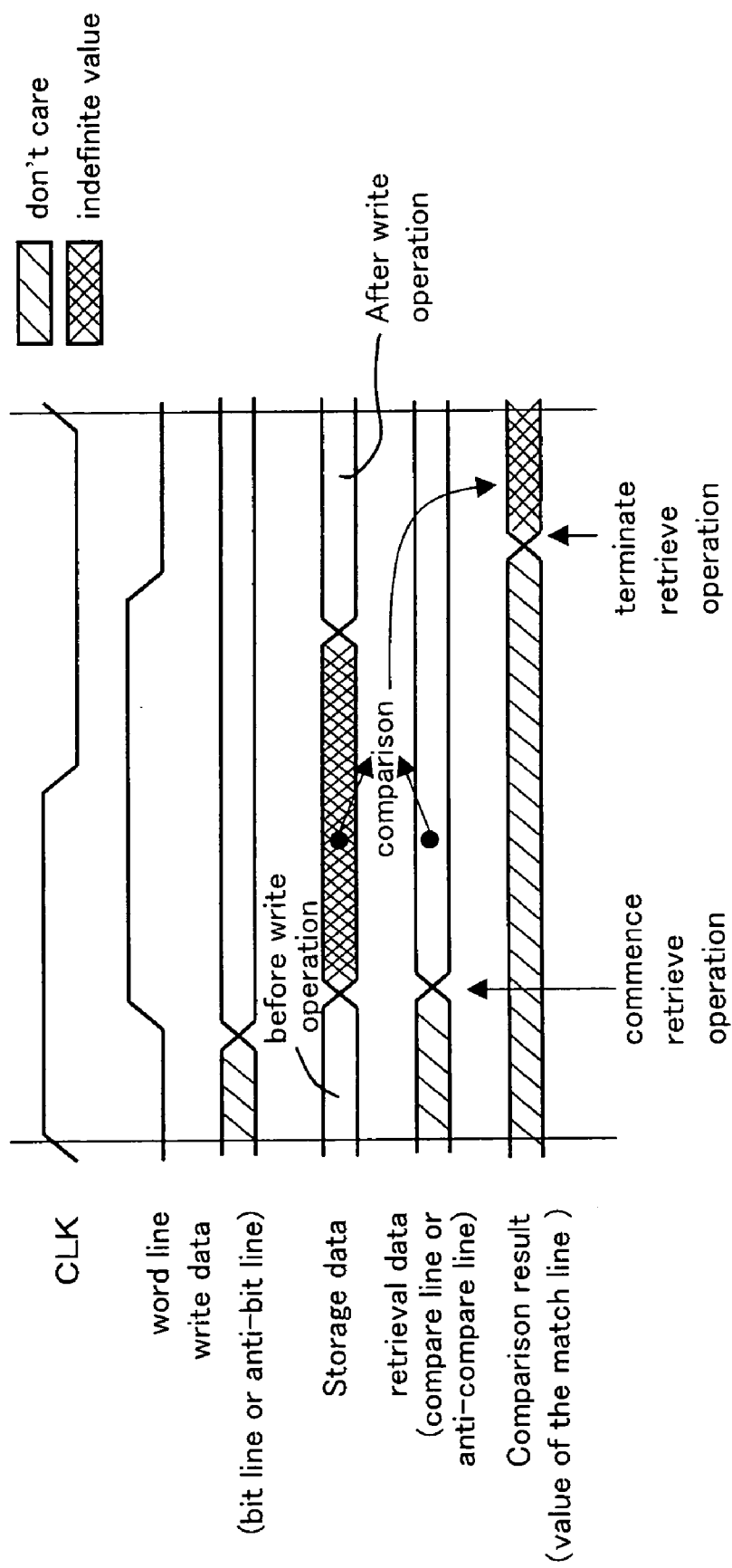
FIG. 14 is a timing chart when the write operation and the retrieve operation are executed based on an identical clock cycle.

FIG. 2 shows a diagram of a CAM circuit according to the first preferred embodiment, wherein a size of each memory cell is 2×2. A reference numeral 20 denotes a CAM memory cell consisting of a memory unit 20$a$ and a data compare unit 20$b$ which are the same as in the conventional technology described in FIG. 10. WL1 and WL2 denote word lines, BL1 and BL2 denote bit lines, /BL1 and /BL2 denote inverse bit lines, CP1 an CP2 denote compare lines, /CP1 and /CP2 denote anti-compare lines, MT1 and MT2 denote match lines, Sw denotes a write instruction signal, $21_1$ and $21_2$ denote consistency cancel circuits, $22_1$ and $22_2$ denote AND circuits, and $23_1$ and $23_2$ denote transistors of an N-channel type. The match lines MT1 and MT2 are respectively connected to drains of transistors to detect a consistency in the data compare units 20b of the CAM memory cells 20. Reference symbols m1 and m2 denote transistors to precharge the match lines MT1 and MT2.

The consistency cancel circuit $21_1$ and $21_2$ respectively correspond to one by one for one word. The consistency cancel circuit $21_1$ comprises an AND circuit $22_1$ to which the word line WL1 and the write instruction signal Sw are inputted and a transistor $23_1$ in which an output of the AND circuit $22_1$ is inputted to a gate, a drain is connected to the match line MT1 and a source is grounded. The consistency cancel circuit $21_2$ is constructed in the same manner.

Next, an operation of the CAM circuit according to the present embodiment constructed as above is described.

Given that the write operation with respect to a first word and the retrieve operation are both instructed based on the identical clock cycle, the write instruction signal Sw is activated, and the pre-charge transistors m1 and m2 are turned on so that the match lines MT1 and MT2 are pre-charged. Further, the word line WL1 corresponding to the selected first word is also activated. Since the word line WL1 is at an "H" level and the write instruction signal Sw is also at the "H" level, the AND circuit $22_1$ of the consistency cancel circuit $21_1$ is conducted, and the transistor $23_1$ is turned on and connected to the ground. As a result, the match line MT1 at the "H" level in the pre-charging step is forcibly made to an "L" level, in other words, enforced to be inconsistent. More specifically, the match line MT is forcibly shifted to the "L" level and thereby judged to be inconsistent irrespective of the consistency/inconsistency in the comparison result of the data compare unit 20b.

Because the judgment of the inconsistency is thus made, it becomes unnecessary to prohibit both of the write operation and the retrieve operation executed based on the identical clock cycle. Therefore, the execution of the write operation and the retrieve operation can be realized based on the identical clock cycle in the CAM memory cell 20 at any address other than the write address. More specifically, the storage data and the values of the compare line CP and the anti-compare line /CP can be compared to each other with respect to the CAM memory cell 20 connected to the word line WL2 and the like other than the first word.

Further, an area increase can be favorably controlled to be less than 1 bit of the memory cell because only one circuit is required for one word in the consistency cancel circuit.

The scope of the present invention includes a case where the signals respectively have a different polarity.

As described, according to the present embodiment, it becomes unnecessary to prohibit both of the write operation and the retrieve operation based on the identical clock cycle, and the both operations can be simultaneously executed.

Second Preferred Embodiment

Figure 3:
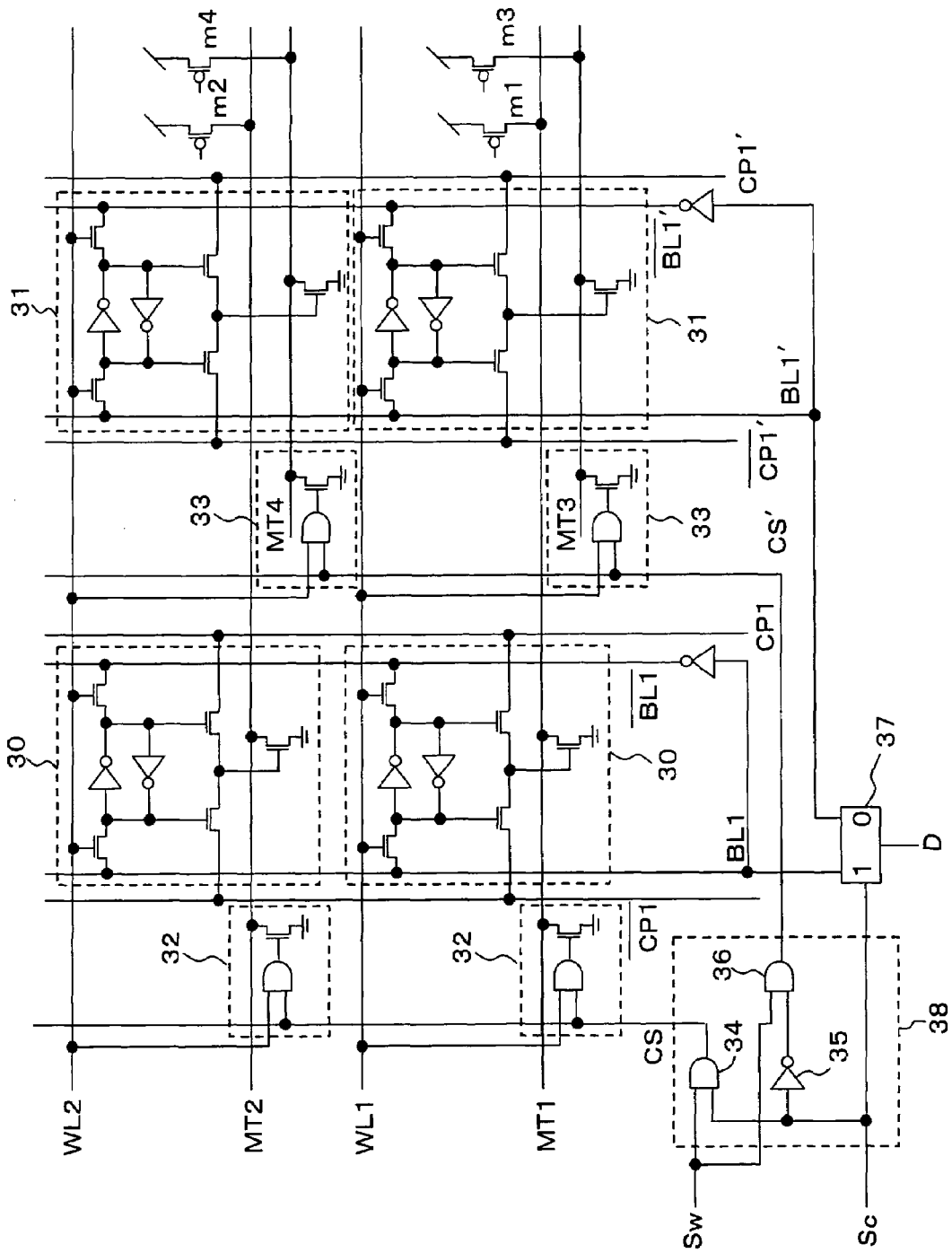
FIG. 3 shows a diagram of a CAM circuit according to a second preferred embodiment of the present invention.

A second preferred embodiment of the present invention relates to a CAM circuit provided with a column select function. FIG. 3 shows a diagram of a CAM circuit according to the second preferred embodiment, wherein a size of the CAM memory cell is by 4×1. Reference numerals 30 and 31 denote CAM memory cells, 32 and 33 denote consistency cancel circuits, 34 and 36 denote AND circuits, 35 denotes an inverter, and 37 denotes a column select circuit.

With respect to the second preferred embodiment, a consistency cancel control circuit 38 comprising the column selecting circuit 37, AND circuits 34 and 36 and the inverter 35 are added because the column select function is provided. Further, the consistency cancel circuits 32 and 33 are arranged because a size of the memory cell is by 4×1 in this embodiment in contrast to the construction shown in FIG. 2 wherein the size of the CAM memory cell is by 2×2. Further, match lines MT1, MT2, MT3 and MT4 are provided, and reference symbols m1, m2, m3 and m4 denote transistors for pre-charging the match lines MT1, MT2, MT3 and MT4.

The AND circuit 34 in the consistency cancel control circuit 38 executes an AND logic of the write instruction signal Sw and a column selection signal Sc, and controls an operation of the consistency cancel circuit 32 by a consistency cancel/select signal CS and a signal of the word line WL. The AND circuit 36 executes the AND logic of the write instruction signal Sw and an inverse signal of the column selection signal Sc by the inverter 35, and controls an operation of the consistency cancel circuit 33 using a resulting consistency cancel/select signal CS' and the signal of the word line WL.

In the present embodiment, a bit line BL1 and an anti-bit line /BL1 are selected by the column select circuit 37 when the column select signal Sc is at the "H" level, while a bit line BL' and an anti-bit line /BL1' are selected by the column select circuit 37 when the column select signal Sc is at the "L" level.

Given that the write operation with respect to a CAM memory cell 30 on a lower side and the retrieve operation are both instructed based on the identical clock cycle in the foregoing constitution, the consistency cancel/select signal CS outputted from the AND circuit 34 is at the "H" level and the word line WL1 is at the "H" level, and a result of the retrieve operation with respect to the CAM memory cell 30 is forcibly judged to be inconsistent. On the other hand, the consistency cancel/select signal CS' outputted from the AND circuit 36 is at the "L" level At the time, the retrieval result with respect to the CAM memory cell 31 is not forcibly judged to be inconsistent even though the word line WL1 is at the "H" level. As a result, the retrieve operation in the CAM circuit provided with the column select function can be realized in the same manner.

The scope of the present invention includes a case where the signals respectively have a different polarity. As described, according to the present embodiment, only the retrieval result at the address selected by the word line and the column selection signal is judged to be inconsistent instead of judging the retrieval results at all of the addresses where the word line is in the enable state to be inconsistent.

As a result, in the case of providing the column address, the write operation and the retrieve operation can be simultaneously executed, and the retrieval result is not forcibly judged to be inconsistent at any unselected address. Thereby, the retrieve operation can be efficiently executed at each memory cell.

Third Preferred Embodiment

Figure 4:
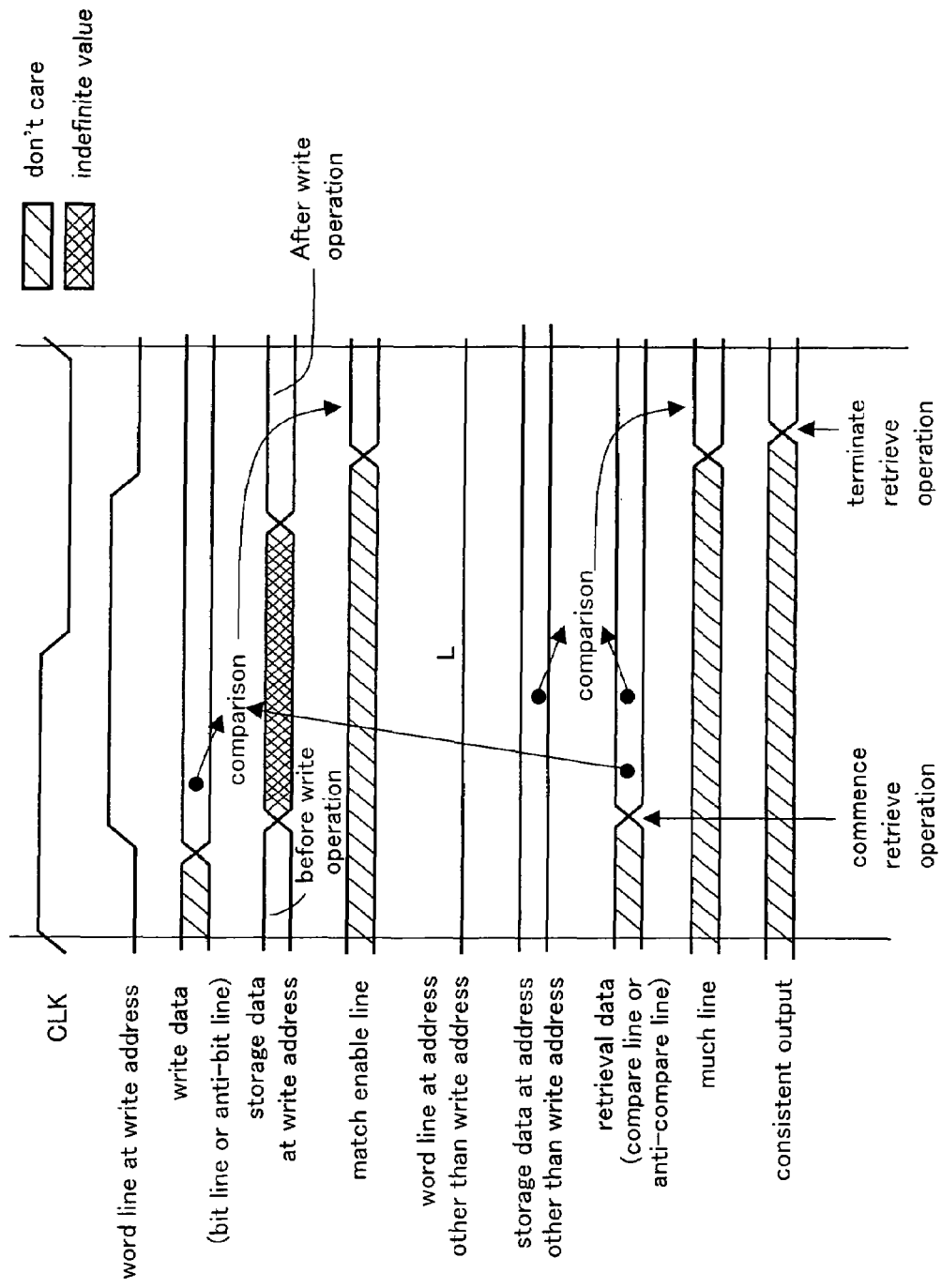
FIG. 4 is a timing chart of a CAM circuit according to a third preferred embodiment of the present invention.

A third preferred embodiment of the present invention is characterized in that the retrieve operation is carried out through the comparison of the write data and the retrieval data in a path before the write data is written in the memory instead of executing the retrieve operation with respect to the write data already stored at the write address. FIG. 4 is a timing chart of a CAM circuit according to the third preferred embodiment. Given that the write operation and the retrieve operation are both instructed based on the identical clock cycle, the retrieve operation is not executed at the write address after the data is stored at the write address, but in the path before the write data is written in the memory. More specifically, a result of comparing a signal of a path from a write data input terminal of the CAM through to the bit line BL of the memory to the values of the compare line CP and the anti-compare line /CP is used as the comparison result at the write address. Thereby, the comparison result between the storage data that is already written and the values of the compare line CP and the anti-compare line /CP can be obtained. At the same time, the storage data at any address other than the write address and the values of the compare line CP and the anti-compare line /CP are compared to each other. Because of the synergy thus obtained, the write operation and the retrieve operation can be simultaneously executed. Further, the comparison result in the data compare unit, if showing the consistency, is not forcibly made to be inconsistent, and the comparison result can be effectively utilized so that the retrieve operation can be efficiently executed.

Figure 5:
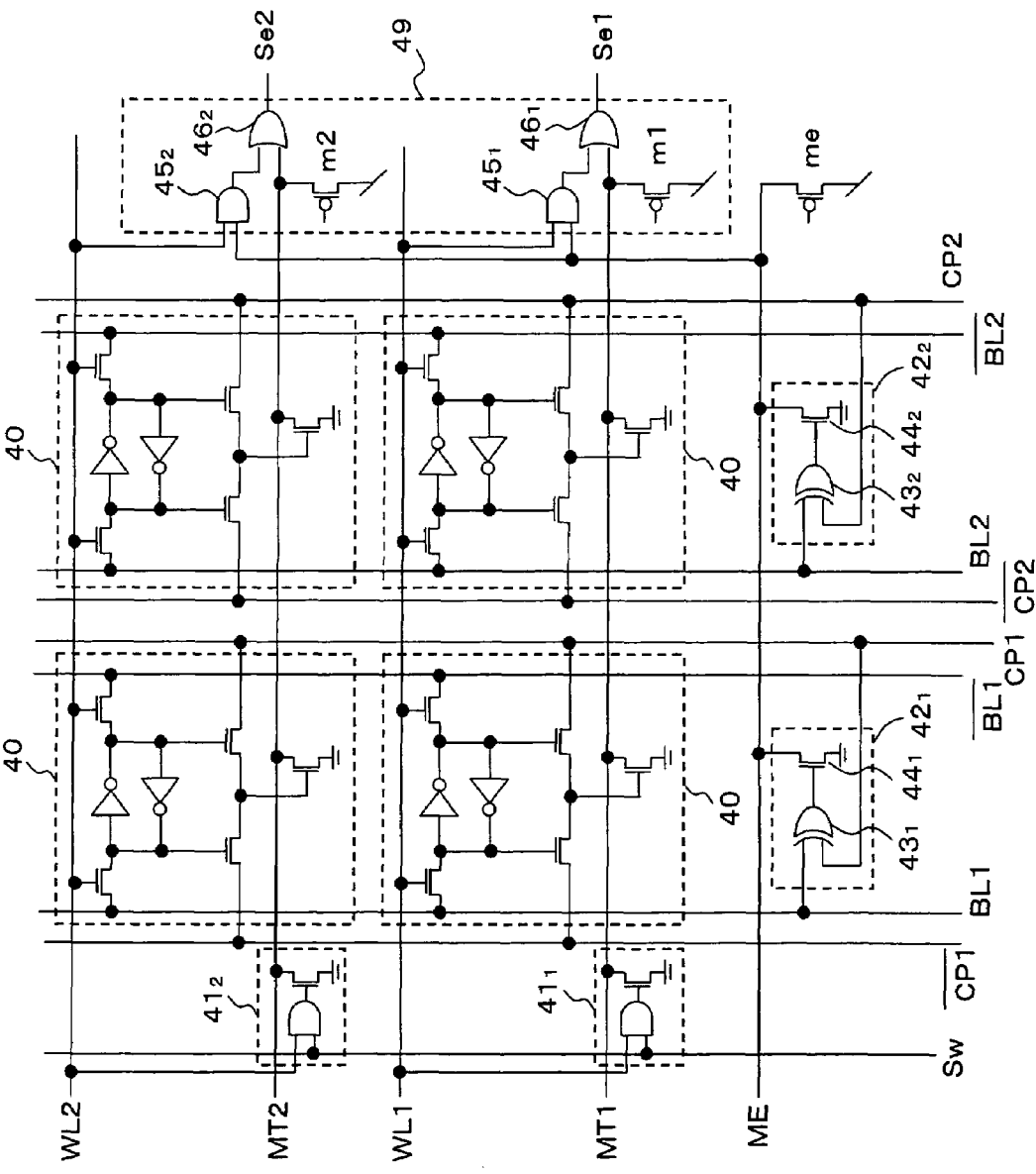
FIG. 5 shows a diagram of the CAM circuit according to the third preferred embodiment.

FIG. 5 shows a diagram of the CAM circuit according to the third preferred embodiment, wherein a size of the CAM memory cell is by 2×2. A reference numeral 40 denotes a CAM memory cell, $41_1$ and $42_2$ denote consistency cancel circuits, $42_1$ and $42_2$ denote write data compare circuits, and $43_1$ and $43_2$ denote exclusive OR circuits. ME denotes a match enable line pre-charged in the same manner as the match lines MT in the retrieve operation, and me denotes a transistor for pre-charging the match enable line ME. The write data compare circuit $42_1$ comprises an exclusive OR circuit $43_1$ for executing an exclusive OR logic of the write data of the bit line BL1 and the compare line CP1 and a transistor $44_1$ in which an output of the exclusive OR circuit $43_1$ is inputted to a gate, a drain is connected to the match enable line ME and a source is grounded. The write data compare circuit $42_2$ is configured in the same manner.

A reference numeral 49 denotes a restoration regulating circuit for denying the output of the forcible inconsistence at the write address by the consistency cancel circuit 41 when the comparison results of the write data compare circuits $42_1$ and $42_2$ show the consistency. The restoration regulating circuit 49 comprises AND circuits $45_1$ and $45_2$ and OR circuits $46_1$ and $46_2$. The match enable line ME and the word line WL1 are inputted to the AND circuit $45_1$, and an output of the AND circuit $45_1$ and the match line MT1 are inputted to the OR circuit $46_1$. A consistency output signal Se1 is outputted from the OR circuit $46_1$ is. The match enable line ME and the word line WL2 are inputted as two sources to the AND circuit $45_2$, and an output of the AND circuit $45_2$ and the match line MT2 are inputted as two sources to the OR circuit $46_2$. A consistency output signal Se2 is outputted from the OR circuit $46_2$.

The write data of the bit line BL and the value of the compare line CP are compared to each other at the write data compare circuits $42_1$ and $42_2$, and an "H" signal of the match enable line ME is retained when all of bits in one word are equal, while "H" is forcibly shifted to "L" when any of the bits in one word is different. The restoration regulating circuit 49 executes the AND logic of the match enable line ME and the word line WL at the AND circuits $45_1$ and $45_2$, and executes the OR logic of the result and the match line MT at the OR circuits $46_1$ and $46_2$. Then, the restoration regulating circuit 49 uses the consistency output signal Se outputted from the OR circuit $46_1$ and $46_2$ as the comparison result at the write address.

The consistency canceling circuits $41_1$ and $41_2$ are constructed and operated in the same manner as described in the first preferred embodiment.

Next, an operation of the CAM circuit according to the present embodiment constructed as above is described.

Below is taken an example in which "11" of two bits is written at the first word, and the retrieval data is "11 of two bits. Provided that the write operation with respect to the first word and the retrieve operation are both instructed based on the identical clock cycle, the write instruction signal Sw is activated, and the pre-charge transistors m1 and m2 are turned on so that the match lines MT1 and MT2 are pre-charged. The match enable line ME is also pre-charged because the pre-charge transistor me is turned on. The word line WL1 corresponding to the selected first word WL1 is also activated.

Because the word line WL1 is at the "H" level and the write instruction signal Sw is also at the "H" level, the transistor of the consistency cancel circuit $41_1$ is turned on, and the match line MT1 is forcibly shifted to the "L" level. However, "1", "1" is inputted to the write data compare circuit $42_1$ because the bit line BL1 and the compare line CP1 show the same value. Therefore, the comparison result shows the consistency, and the output of the exclusive OR circuit $43_1$ is at the "L" level and the transistor $44_1$ is turned off. "1", "1" is inputted to the write data compare circuit $42_2$ because the bit line BL2 and the compare line CP2 show the same value. Therefore, the comparison result shows the consistency, and the output of the exclusive OR circuit $43_2$ is at the "L" level and the transistor $44_2$ is turned off. As a result, the match enable line ME maintains the "H" level. The word line WL1 is at the "H" level, and therefore, the output of the AND circuit $45_1$ in the restoration regulating circuit 49 is at the "H" level. Then, the output of the OR circuit $46_1$, that is the consistency output signal Se1, is at the "H" level even though the value of the match line MT1 is forcibly shifted to the "L" level.

In the foregoing description, the retrieve operation is practically executed in the data compare circuits $42_1$ and $42_2$. When the comparison results with respect to the write data and the retrieval data in the write data compare circuits $42_1$ and $42_2$ both show the consistency, the process of the forcible inconsistency in the consistency cancel circuit $41_1$ is denied by the restoration regulating circuit 49. Then, the result of the retrieve operation is ultimately judged to be consistent.

Provided that "11" of two bits is written at the first word and the retrieval data is "01" of two bits, the output of the exclusive OR circuit $43_1$ is at the "H" level, and the transistor $44_1$ is turned on. Then, the match enable line ME is at the "L" level. As a result, the consistency output signal Se1 is at the "L" level.

When at least one of the write data compare circuits $42_1$ and $42_2$ shows the inconsistency, the process of the forcible inconsistency in the consistency cancel circuit $41_1$ is selected.

The write data compare circuits $42_1$ and $42_2$ respectively require a circuit per one bit, and the areas of them are only increased by one word occupation in the memory cell.

The scope of the present invention includes a case where the signals respectively have a different polarity.

Figure 6:
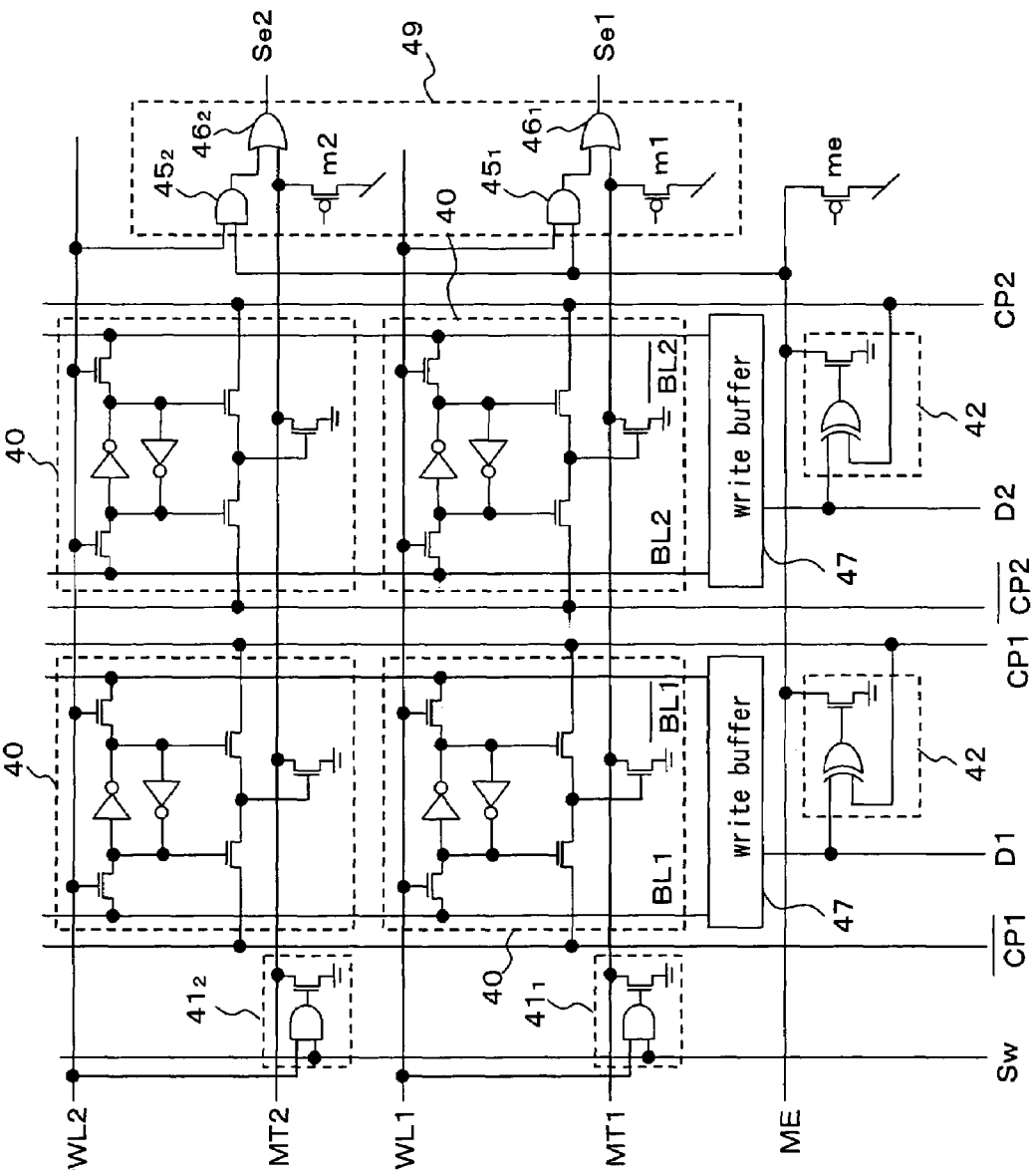
FIG. 6 shows a diagram of another CAM circuit according to the third preferred embodiment.

As another possible example of the circuit, the write data compare circuit 42 may be provided in a previous stage of a write buffer 47 as shown in FIG. 6.

As described, according to the present embodiment, the write operation and the retrieve operation can be simultaneously executed. When the comparison results in the write data compare circuits show the consistency in the path before the write data is written in the memory, the comparison results in the write data compare circuits are not forcibly made to be inconsistent but effectively utilized. As a result, the retrieve operation can be efficiently executed.

Fourth Preferred Embodiment

A fourth preferred embodiment of the present invention relates to a CAM circuit provided with a mask function. Provided that the write operation with respect to the CAM memory or a mask memory and the retrieve operation are both instructed based on the identical clock cycle, the comparison result between the values of the compare line CP and the anti-compare line /CP, and the storage data at the write address is made to be inconsistent. In case of the write operation to the CAM memory, the retrieve operation is executed in the write data compare circuits in the path before the write data is written in the memory. In other words, the signal of the path from the write data input terminal through to the bit line BL and the values of the compare line CP and the anti-compare line /CP are compared to each other. On the other hand, in case of the write operation to the mask memory, the comparison result at the write address is judged to be consistent when the signal of the path from the write data input terminal through to the bit line BL of the memory is "1", while being decided to be inconsistent when the signal is "0". At the same time, the simultaneous execution of the write operation and the retrieve operation based on the identical clock cycle can be realized by the process that the storage data at any address other than the write address and the values of the compare line CP and the anti-compare line /CP are compared. Further, the mask function can be exerted at a desired level.

Figure 7:
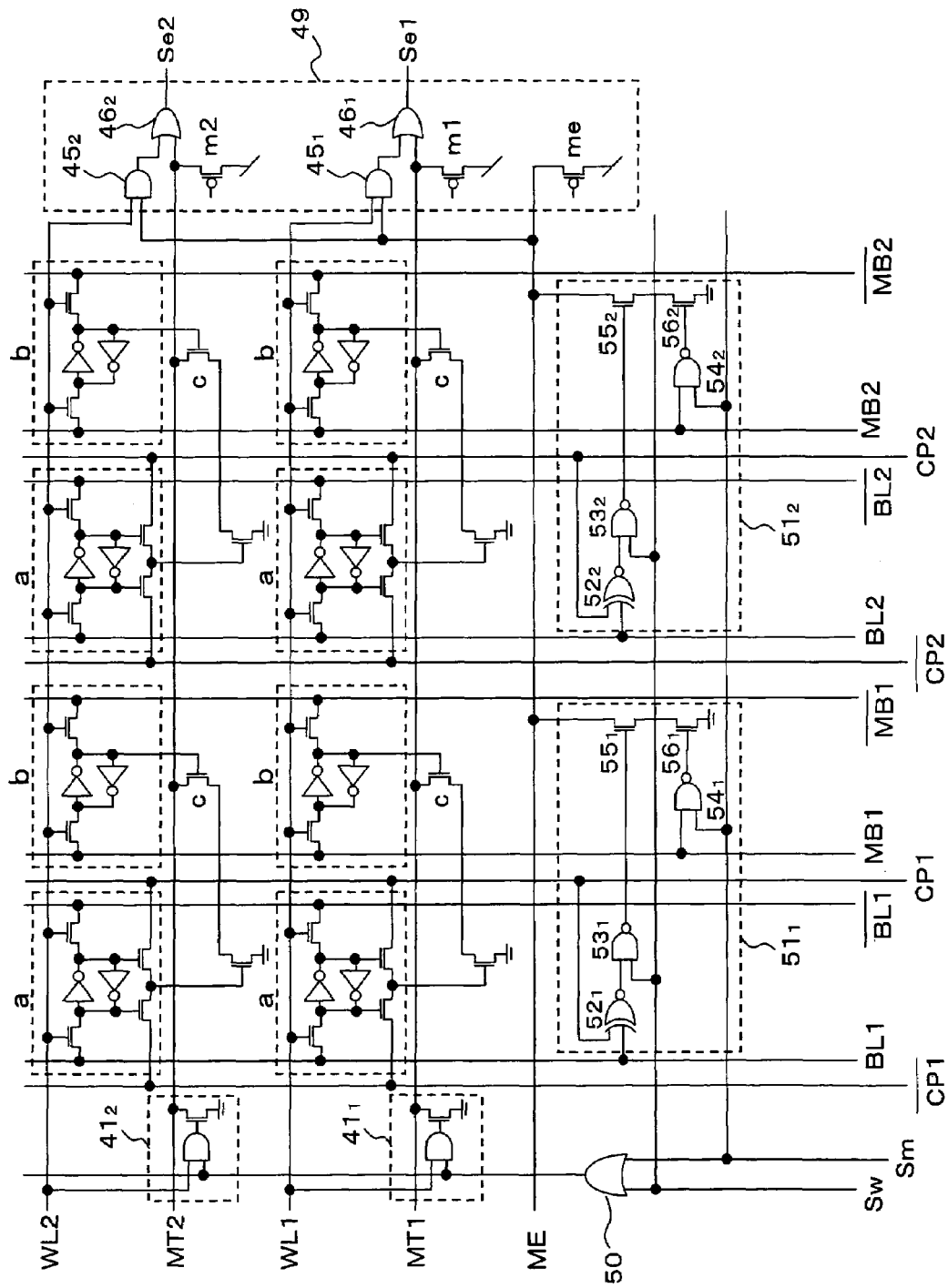
FIG. 7 shows a diagram of a CAM circuit according to a fourth preferred embodiment of the present invention.

FIG. 7 shows a diagram of a CAM circuit according to the fourth preferred embodiment, wherein a size of the CAM memory cell and a size of the mask memory cell are by 2×2 respectively.

A reference symbol a denotes a CAM memory cell, b denotes a mask memory cell, and c denotes a transistor for connecting the mask memory cell b to the match line MT.

A reference numeral 50 denotes an OR circuit for taking a logical sum of the write instruction signal Sw of the CAM memory and a write instruction signal Sm of the mask memory, and the logical sum signal is inputted from the OR circuit 50 to the AND circuits in the consistency cancel circuits 41$_1$ and 41$_2$.

A write data compare circuit 51$_1$ comprises an exclusive NOR circuit 52$_1$, NAND circuits 53$_1$ and 54$_1$, and transistors 55$_1$ and 56$_1$ of the N-channel type. The bit line BL1 and the compare line CP1 are connected to two inputs of the exclusive NOR circuit 52$_1$. An output of the exclusive NOR circuit 52$_1$ and the write instruction signal Sw of the CAM memory are connected to two inputs of the NAND circuit 53$_1$. The mask bit line MB1 and the write instruction signal Sm of the mask memory are connected to two inputs of the NAND circuit 54$_1$. An output of the NAND circuit 53$_1$ is connected to a gate of the transistor 55$_1$, and an output of the NAND circuit 54$_1$ is connected to a gate of the transistor 56$_1$. The transistors 55$_1$ and 56$_1$ are linearly connected, and the match enable line ME is grounded via the transistors 55$_1$ and 56$_1$ that are linearly connected. A write data compare circuit 51$_2$ is constructed in the same manner.

The write data compare circuits 51$_1$ and 51$_2$ respectively require a circuit per one bit, and the areas of them are only increased by one word occupation in the memory cell.

Next, an operation of the CAM circuit according to the present embodiment constructed as above is described.

1. Operation when the retrieval data is consistent with the write data

Below is taken an example where "11" of two bits is written in the CAM memory cell of the first word, and the retrieval data is "11" of two bits. Provided that the write operation to the first word and the retrieve operation are both instructed based on the identical clock cycle, the match enable line ME is pre-charged in the same manner as the match line MT in the retrieve operation. The write instruction signal Sw of the CAM memory is activated to be at the "H" level, while the write instruction signal Sm of the mask memory remains inactive at the "L" level.

The match line MT1 made "H" in the pre-charge in advance is enforced to be "L" by the consistency cancel circuit 41$_1$. At the time, the bit line BL1 and the compare line CP1 show the same value, and therefore, the output of the exclusive NOR circuit 52$_1$ in the write data compare circuit 51$_1$ is at the "H" level, and the write instruction signal Sw of the CAM memory is at the "H" level. Then, the output of the NAND circuit 53$_1$ is at the "L" level, and the transistor 55$_1$ remains turned off. While because the bit line BL2 and the compare line CP2 also show the same value, the transistor 55$_2$ in the write data compare circuit 51$_2$ also remains turned off as a result of the same operation as in the first bit. Then, the match enable line ME in the pre-charged state keeps the "H" level. The output of the AND circuit 45$_1$ in the restoration regulating circuit 49 is at the "H" level because the word line WL1 is at the "H" level. Therefore, the consistency output signal Se1 from the OR circuit 46$_1$ is at the "H" level even though the value of the match line MT1 is forcibly made "L" because the write operation and the retrieve operation are both executed based on the identical clock cycle. At the time, the transistor 56$_1$ is in the ON state because the write instruction signal Sm of the mask memory is at the "L" level and the output of the NAND circuit 54$_1$ is at the "H" level, which, however, does not influence the operation result described above.

2. Operation when the retrieval data is inconsistent with the write data

Below is taken an example where "11" of two bits is written in the CAM memory cell of the first word, and the retrieval data is "01" of two bits. The output of the exclusive NOR circuit 52$_1$ in the write data compare circuit 51$_1$ is, on the contrary to the foregoing description, at the "L" level, and the output of the NAND circuit 53$_1$ is at the "H" level. Thereby, the transistor 55$_1$ is turned on. Because the write instruction signal Sm of the mask memory is at the "L" level as described, the transistor 56$_1$ is in the ON state. As a result, the match enable line ME is inverted to be at the "L" level, and the consistency output signal Se1 is at the "L" level.

In the CAM circuit comprising the mask function, the write data compare circuits provided in the previous stage of the main body of the memory cell and the restoration regulating circuit, the operation is carried out in the same manner as in the third preferred embodiment if the write instruction signal Sm of the mask memory is made inactive in the CAM circuit when the write operation and the retrieve operation are both instructed based on the identical clock cycle.

3. When "11" is set in the mask memory cell

Below is taken an example where "11" of two bits is written in the mask memory cell b a of the first word. Provided that the write operation to the first word and the retrieve operation are both instructed based on the identical clock cycle, the write instruction signal Sm of the mask memory is activated to be at the "H" level, while the write instruction signal Sw of the CAM memory remains inactive at the "L" level.

In this case the match line MT1 is forcibly made "L" by the consistency cancel circuit 41$_1$, however, the mask bit line MB1 is at the "H" level and the write instruction signal Sm of the mask memory is at the "H" level. Therefore, the output of the NAND circuit 54₁ in the write data compare circuit 51₁ is at the "L" level, and the transistor 56₁ is turned off. Because the mask bit line MB2 is also at the "H" level, the transistor 56₁ in the write data compare circuit 51₂ is also turned off in the same operation as in the first bit. As a result, the match enable line ME in the pre-charged state maintains the "H" level. Because the word line WL1 is at the "H" level, the output of the AND circuit 45₁ in the restoration regulating circuit 49 is at the "H" level. Therefore, the consistency output signal Se1 from the OR circuit 46₁ is at the "H" level even though the value of the match line MT1 is at the "L" level because the write operation and the retrieve operation are both executed based on the identical clock cycle. At the time, the transistors 55₁ and 55₂ are in the ON state because the write instruction signal Sw of the CAM memory is at the "L" level and the outputs of the NAND circuits 53₁ and 53₂ are at the "H" level, however, the transistors 56₁ and 56₂ are in the OFF state. Then, the foregoing operation result is not influenced at all.

4. When "01" is set in the mask memory cell

Below is taken an example where "01" of two bits is written in the mask memory cell b of the first word. The output of the NAND circuit 54₁ in the write data compare circuit 51₁ is at the "H" level because the mask bit line MB1 is at the "L" level, and the transistor 56₁ is inverted to be turned on. Further, the transistor 55₁ is in the ON state because the write instruction signal Sw of the CAM memory is at the "L" level as described. As a result, the match enable line ME is inverted to be at the "L" level, and the consistency output signal Se1 is at the "L" level.

The consistency output signal Se1 is also at the "L" level in the same manner in case that "10" or "00" is set in the mask memory cell.

The scope of the present invention includes a case where the signals respectively have a different polarity.

Figure 8:
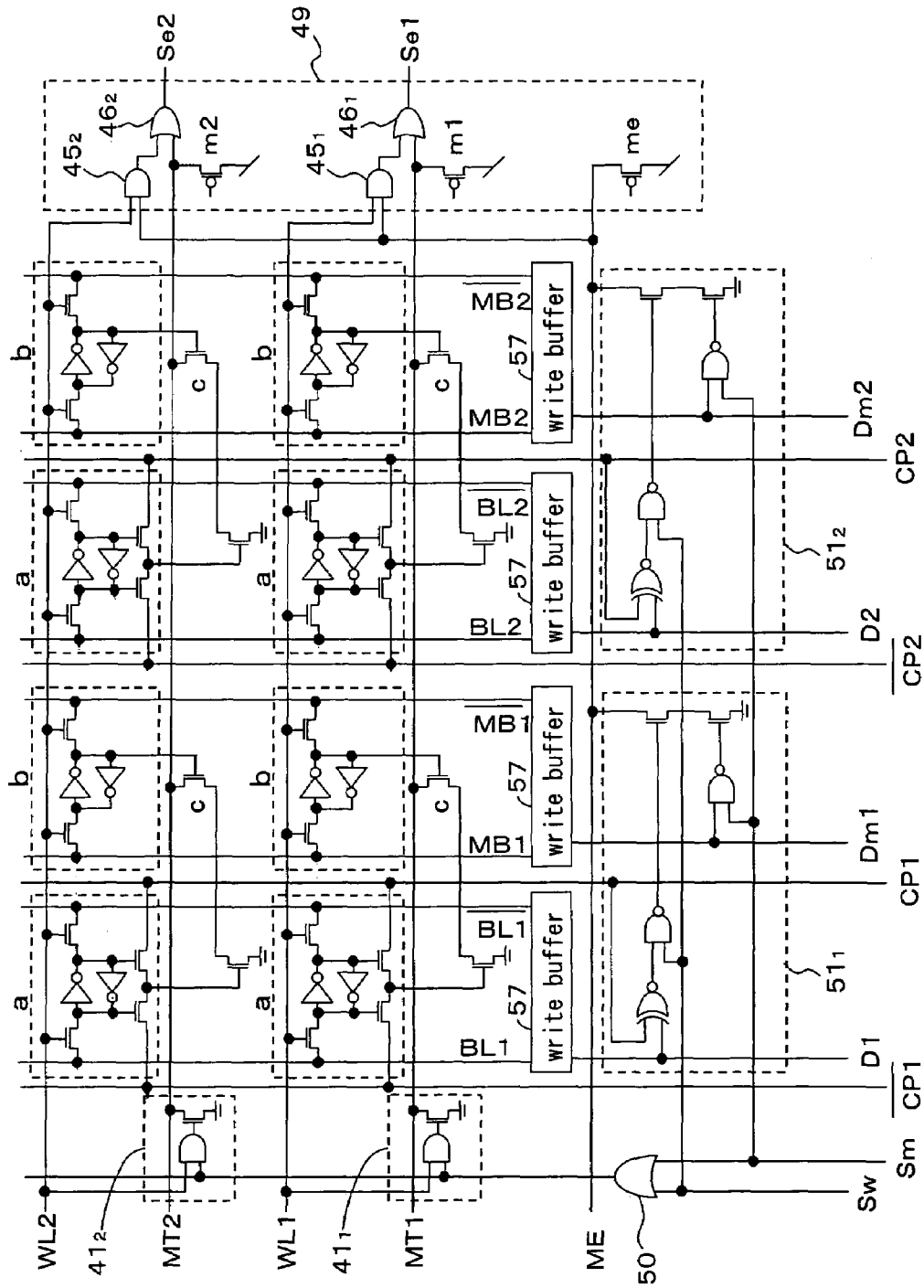
FIG. 8 shows a diagram of another CAM circuit according to the fourth preferred embodiment.

In the present embodiment, the comparison is carried out in the write data to the CAM memory cell before input to the write buffer and the write data with respect to the compare line CP and the mask memory cell. It is thought as another possible example of the circuit that the write data compare circuit 51 may be provided in a previous stage of a write buffer 57 as shown in FIG. 8.

As described above, according to the present embodiment, the simultaneous execution of the write operation and the retrieve operation is allowed in the CAM circuit provided with the mask function. Further, when the comparison results in the write data compare circuits show the consistency, the comparison results in the data compare circuits are not forcibly made to be inconsistent but effectively utilized. As a result, the retrieve operation can be efficiently executed. Further, the mask function can be exerted at a desired level.

Fifth Preferred Embodiment

Figure 9:
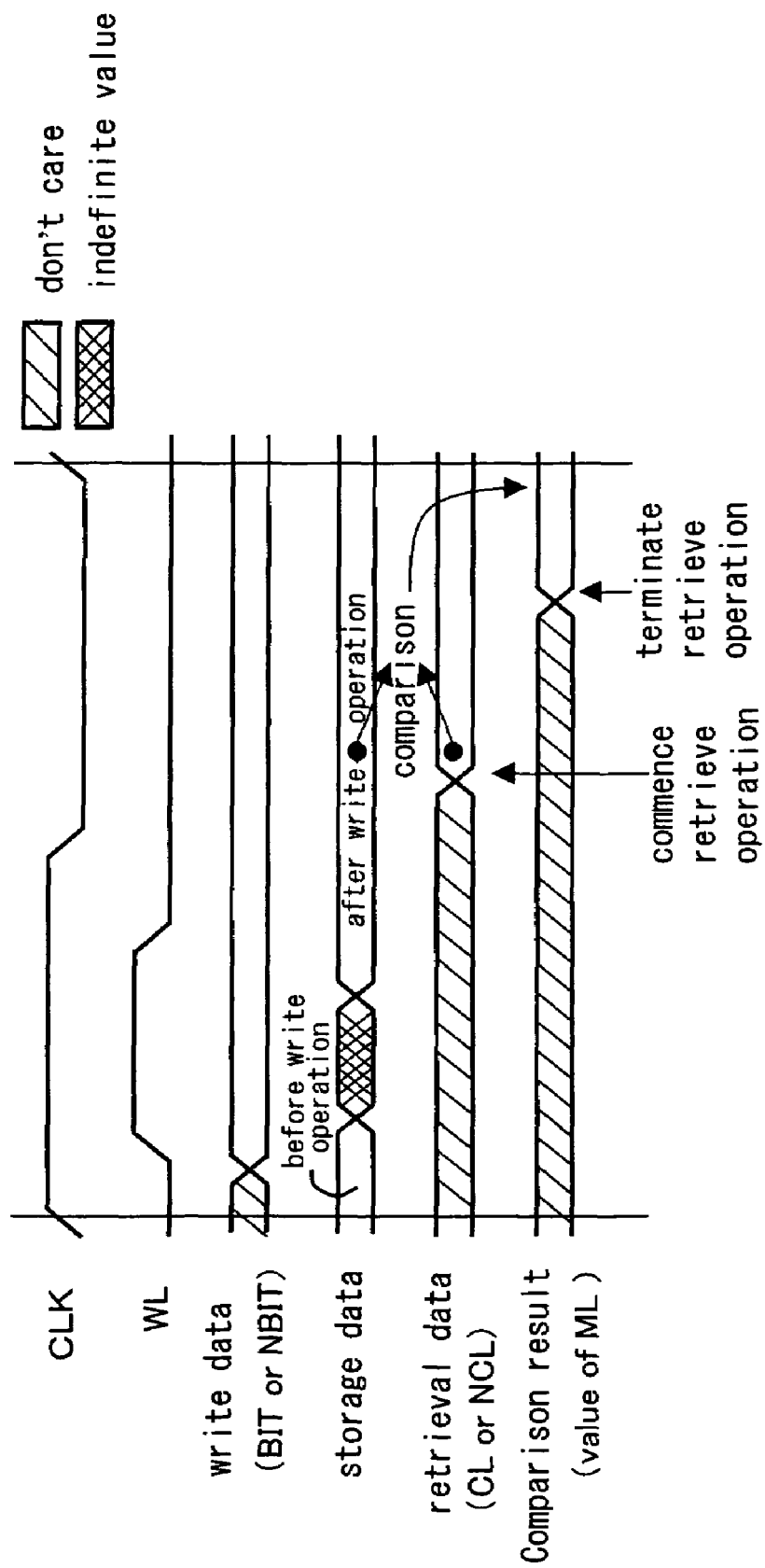
FIG. 9 is a timing chart of a CAM circuit according to a fifth preferred embodiment of the present invention.

FIG. 9 is a timing chart of a CAM circuit according to a fifth preferred embodiment of the present invention. As shown in the drawing, the present embodiment is characterized in that the clock cycle based on which the write operation and the retrieve operation are both executed is divided in half at time so that the write operation is executed in the first half of the clock cycle and the retrieve operation is executed in the latter half of the clock cycle. Because the storage data is already rewritten before the retrieve operation is started in the present embodiment, the retrieval result (value of the match line) is not be indefinite. Alternatively, the operations may be carried out in the different order in such manner that the retrieve operation is executed in the first half of the clock cycle, and the write operation is executed in the latter half of the clock cycle.

As described, according to the present embodiment, a period of the write operation to the memory and the retrieve operation is divided at time in one clock cycle and the both operations are completed in the respective period. As a result, any indefinite value is not generated inside the memory in the retrieve operation, and the write operation to the memory and the retrieve operation are both executed based on the identical clock cycle. Therefore, it becomes unnecessary to prohibit the write operation and the retrieve operation based on the identical clock cycle, and the write operation to the memory and the retrieve operation can be realized based on the identical clock cycle (first half and latter half) without forcibly making the comparison results in the data compare circuits to be inconsistent.

INDUSTRIAL APPLICABILITY

A CAM circuit according to the present invention is effective as a network switch, cash memory and the like.

What is claimed is:

1. A CAM circuit comprising:
a memory unit connected to a word line and a bit line;
a data compare unit connected to a match line and a compare line, the data compare unit comparing a data stored in the memory unit to a data of the compare line in a state where the match line is activated;
a consistency cancel circuit provided in each word line and each match line, the consistency cancel circuit forcibly making the match line inactive when the word line and a write instruction signals are both activated.

2. The CAM circuit according to claim 1, further comprising:
a column select circuit for selecting the bit line in accordance with a column selection signal; and
a consistency cancel control circuit for generating and outputting a consistency cancel/select signal to the consistency cancel circuit in accordance with a combination of the write instruction signal and the column selection signal.

3. The CAM circuit according to claim 1, further comprising:
a write data compare circuit for comparing a signal of a path before a write data is written in the memory unit to a retrieval data outside the memory unit; and
a restoration regulating circuit for denying an output of a forcible inconsistency by the consistency cancel circuit at a write address when a result of the comparison by the write data compare circuit shows consistency.

4. A CAM circuit comprising:
a CAM memory cell comprising a CAM memory unit connected to a word line and a bit line;
a data compare unit connected to a match line and a compare line in order to compare a data stored in the CAM memory unit to a data in the compare line in a state where the match line is activated;
a mask memory cell comprising a mask bit line, the word line shared with the CAM memory unit and a mask memory unit, wherein the mask memory cell has a role to stop the operation of the data compare unit in the active state;
a consistency cancel circuit for changing a value of the match line according to a value of a write instruction signal and the word line;

a write data compare circuit for comparing a signal of a path before a write data is written in the memory unit to a retrieval data outside the memory unit; and a restoration regulating circuit for denying an output of a forcible inconsistency by the consistency cancel circuit at a write address when a result of the comparison by the write data compare circuit shows consistency.

5. An output method of a CAM circuit comprising:

a memory unit connected to a word line and a bit line; and a data compare unit connected to a match line and a compare line, which has a role to compare a data stored in the memory unit to a data of the compare line in a state where the match line is activated, wherein a state of the corresponding match line is forcibly made to be inconsistent in the case of detecting that the word line and a write instruction signal are both in an enable state when a write operation and a retrieve operation are both instructed based on an identical clock cycle.

6. The output method of a CAM circuit according to claim 5, wherein the corresponding match line is made to be inconsistent in the case of detecting that the write instruction signal, the word line and the column selection signal are all in the enable state when a write operation with respect to the memory and a retrieve operation are both instructed based on an identical clock cycle.

7. The output method of a CAM circuit according to claim 5, wherein a signal of a path before a write data is written in the memory unit and a retrieval data are compared to each other outside the memory unit when the write operation to the memory and the retrieve operation are both instructed based on the identical clock cycle, and a consistency detection result at a write address is changed from inconsistency to consistency according to a result of the comparison.

8. An output method of a CAM circuit comprising:

a CAM memory cell comprising a CAM memory unit connected to a word line and a bit line;

a data compare unit connected to a match line and a compare line, which has a role to compare a data stored in the CAM memory unit to a data in the compare line in a state where the match line is activated;

a mask memory cell comprising a mask bit line, the word line shared with the CAM memory unit and a mask memory unit, which has a role to stop the operation of the data compare unit in the active state;

a consistency cancel circuit for changing a value of the match line according to a write instruction signal and a value of the word line; and a write data compare circuit for comparing a signal of a path before a write data is written in the memory unit to a retrieval data outside the memory unit, wherein a state of the corresponding match line is forcibly made to be inconsistent in the case of detecting that the word line and a write instruction signal are both in an enable state when a write operation and a retrieve operation are both instructed based on an identical clock cycle, the signal of the path before the write data is written in the memory unit and the retrieval data are compared to each other outside CAM memory unit and the mask memory unit, and a consistency detection result at a write address is changed from inconsistency to consistency according to a result of the comparison.

* * * * *